(12) United States Patent
Kuroiwa et al.

(10) Patent No.: US 8,492,881 B2
(45) Date of Patent: Jul. 23, 2013

(54) MAGNETIC STORAGE DEVICE

(75) Inventors: Takeharu Kuroiwa, Tokyo (JP);
Masayoshi Tarutani, Tokyo (JP);
Takashi Takenaga, Tokyo (JP); Hiroshi Takada, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 647 days.

(21) Appl. No.: 12/728,885

(22) Filed: Mar. 22, 2010

(65) Prior Publication Data

US 2010/0254182 A1 Oct. 7, 2010

(30) Foreign Application Priority Data

Apr. 1, 2009 (JP) ................. 2009-089207

(51) Int. Cl.
*H01L 23/552* (2006.01)
*H01L 29/82* (2006.01)
*G11C 11/00* (2006.01)
*G11C 11/14* (2006.01)

(52) U.S. Cl.
USPC .... 257/659; 257/421; 257/422; 257/E23.114; 365/158; 365/171

(58) Field of Classification Search
USPC ................. 365/158, 171; 257/421, 422, 677, 257/659, E23.114
See application file for complete search history.

(56) References Cited

U.S. PATENT DOCUMENTS

| | | | |
|---|---|---|---|
| 6,005,800 A | 12/1999 | Koch et al. | |
| 6,165,803 A | 12/2000 | Chen et al. | |
| 6,368,878 B1 | 4/2002 | Abraham et al. | |
| 6,570,783 B1 | 5/2003 | Deak | |
| 6,605,836 B2 | 8/2003 | Kishi et al. | |
| 7,119,419 B2 * | 10/2006 | Kato et al. | 257/659 |
| 8,120,949 B2 * | 2/2012 | Ranjan et al. | 365/171 |
| 8,258,604 B2 * | 9/2012 | Bando et al. | 257/659 |
| 2002/0048690 A1 * | 4/2002 | Fukuzawa et al. | 428/692 |
| 2005/0226030 A1 | 10/2005 | Kato et al. | |

FOREIGN PATENT DOCUMENTS

| | | |
|---|---|---|
| JP | 11-273337 | 10/1999 |
| JP | 2000-353791 | 12/2000 |
| JP | 2002-280637 | 9/2002 |
| JP | 2004-200185 | 7/2004 |

(Continued)

OTHER PUBLICATIONS

D.H. Mosca et al., "Oscillatory interlayer coupling and giant magnetoresistance in Co/Cu multilayers," Journal of Magnetism and Magnetic Material 94, 1991 pp. L1-L5.

(Continued)

*Primary Examiner* — Allison P Bernstein
(74) *Attorney, Agent, or Firm* — McDermott Will & Emery LLP

(57) ABSTRACT

A magnetic storage device which enables stable operation at the time of recording information into MRAM and the stable retention of recorded information. The die of the magnetic storage device has a substrate, first and second wirings, a magnetic storage element and a first magnetic shielding structure. The first magnetic shielding structure is formed to cover the magnetic storage element in a plan view. Second and third magnetic shielding structures sandwich the die in a thickness direction. A lead frame member has the die mounted thereon and contains a ferromagnetic material. The lead frame member overlaps with only part of the die in a plan view.

16 Claims, 17 Drawing Sheets

FOREIGN PATENT DOCUMENTS

| | | |
|---|---|---|
| JP | 2004-296858 | 10/2004 |
| JP | 2005-310971 | 11/2005 |
| JP | 2005-340237 | 12/2005 |

OTHER PUBLICATIONS

S.S.P. Parkin et al., "Oscillatory Magnetic Exchange Coupling through Thin Copper Layers," Physical review Letters, vol. 66, No. 16, Apr. 1991, pp. 2152-2155.

W.P. Pratt et al., "Perpendicular Giant magnetoresistance of Ag/Co Multilayers," Physical review Letters, vol. 66, No. 23, Jun. 1991, pp. 3060-3063.

T. Miyazaki et al., "Giant magnetic tunneling effect in Fe/A1203/Fe junction," Journal of Magnetism and Magnetic Materials 139(1995) pp. L231-L234.

S. Tehrani et al., "High density submicron magnetoresistive random access memory (invited)," Journal of Applied Physics, vol. 85, No. 8, Apr. 1999, pp. 5822-5827.

S.S.P. Parkin et al., "Exchange-biased magnetic tunnel junctions and application to nonvolatile magnetic random access memory (invited)," Journal of Applied Physics, vol. 85, No. 8 Apr. 1999, pp. 5828-5833.

* cited by examiner

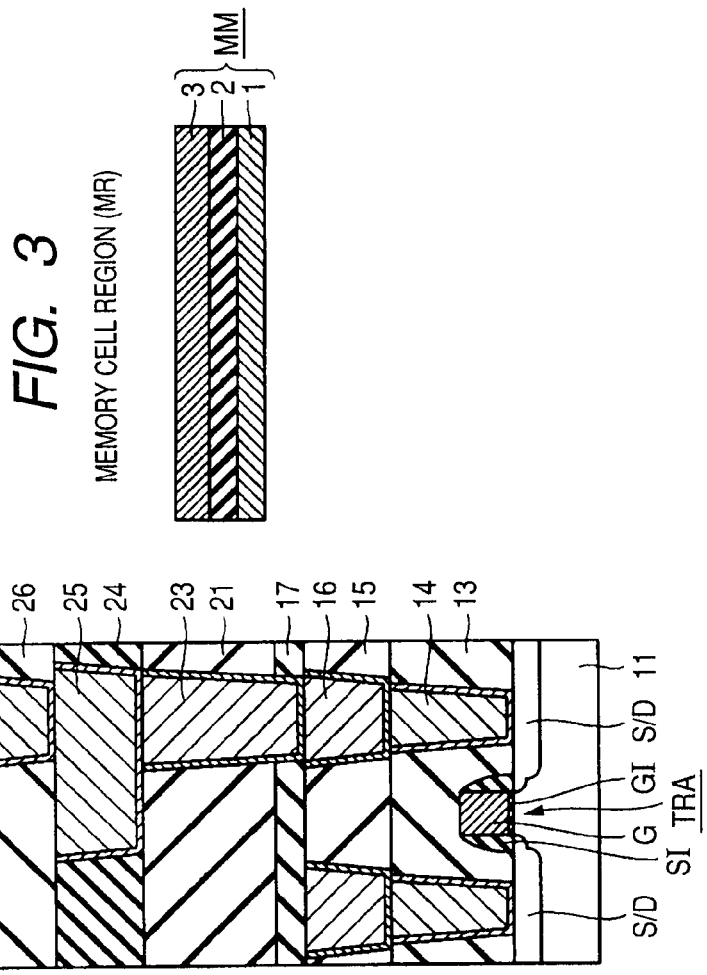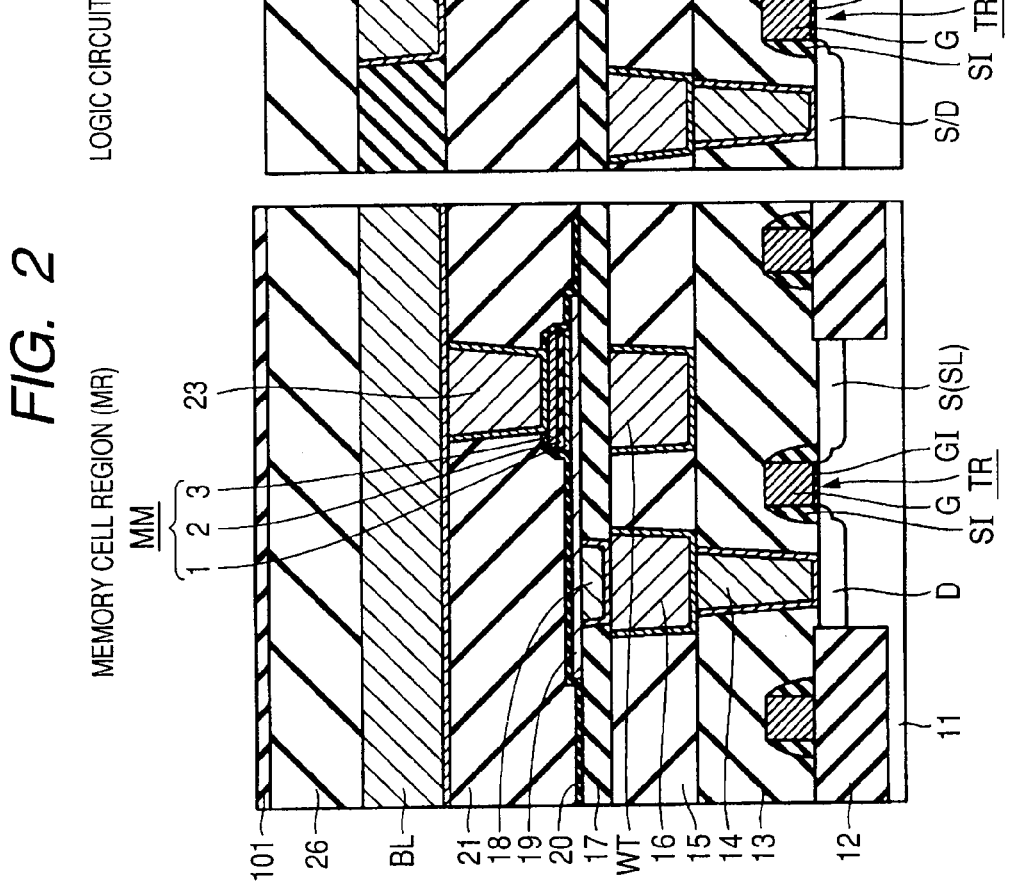

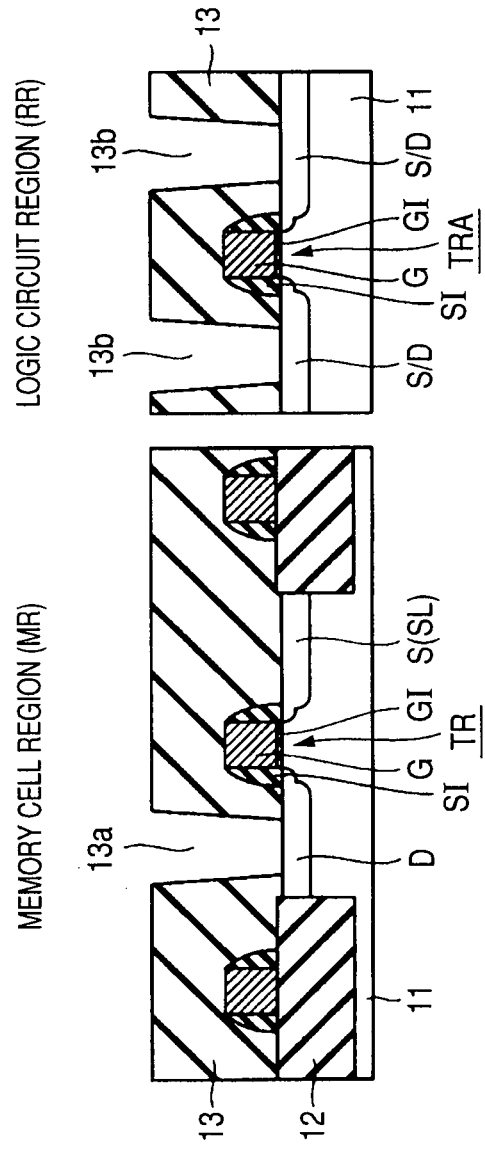

113 110 112 114

113 110 112 114

114

113 110 112 114

MAGNETIC STORAGE DEVICE

CROSS-REFERENCE TO RELATED APPLICATIONS

The disclosure of Japanese Patent Application No. 2009-89207 filed on Apr. 1, 2009 including the specification, drawings and abstract is incorporated herein by reference in its entirety.

BACKGROUND OF THE INVENTION

The present invention relates to a magnetic storage device and, particularly, to a magnetic storage device having a lead frame member.

A magnetoresistive effect is a phenomenon that electric resistance is changed by applying a magnetic field to a magnetic material and used in magnetic sensors and magnetic heads. Particularly, Fe/Cr and Co/Cu artificial lattice films are introduced in Non-patent Documents 1 and 2 as giant magnetoresistive (GMR) effect materials which show a very large magnetoresistive effect.

There is proposed a magnetoresistive effect element which has a non-magnetic metal layer thick enough to lose an exchange coupling function between ferromagnetic layers and a laminate structure comprising a ferromagnetic layer, a non-magnetic layer, a ferromagnetic layer and an antiferromagnetic layer. In this element, one of the ferromagnetic layers and the antiferromagnetic layer are exchange-coupled to each other to fix the magnetic moment of the ferromagnetic layer so that only the magnetization of the other ferromagnetic layer can be easily reversed with an external magnetic field. This is an element commonly known as "spin valve film". Since exchange-coupling between the two ferromagnetic layers is weak in this element, magnetization can be reversed with a small magnetic field. Therefore, a spin valve film can provide a high-sensitivity magnetoresistive element as compared with the above exchange-coupled film. FeMn, IrMn or PtMn may be used as the material of the antiferromagnetic layer. This spin valve film is used in a reproducing head for high-density magnetic recording, and a current is applied in the in-plane direction of the film at the time of use.

Meanwhile, Non-patent Document 3 discloses that a magnetoresistive effect is obtained even by using a perpendicular magnetoresistive effect in which a current is applied in a direction perpendicular to the surface of a film.

Further, Non-patent Document 4 discloses a tunneling magnetoresistive (TMR) effect obtained by a ferromagnetic tunnel junction. This tunnel magnetoresistance makes use of the fact that the size of a tunnel current in a direction perpendicular to the surface of a film is changed by making the magnetization directions of the two ferromagnetic layers parallel or antiparallel to each other with an external magnetic field in a three-layer film consisting of a ferromagnetic layer, an insulating layer and a ferromagnetic layer.

Research into the use of GMR and TMR elements in nonvolatile magnetic random access memories (MRAM) has recently been reported in Non-patent Documents 5 and 6, for example.

To use the above elements in MRAM, GMR and TMR elements are arranged in a matrix, a current is applied to a wiring provided separately to apply a magnetic field, and two magnetic layers forming these elements are controlled to be parallel or antiparallel to each other, thereby recording "1" and "0". Reading is carried out by using a GMR or TMR effect.

Currently, MRAM comprising TMR elements is mainly under study. This is because MRAM comprising TMR elements can obtain a larger output voltage due to an MR change rate (MR rate) of 20% or more at room temperature and a large resistance at a tunnel junction. Further, MRAM comprising TMR elements does not need to carry out the reversal of magnetization at the time of reading, thereby making it possible to read with a small current. Therefore, MRAM comprising TMR elements is expected to be used as a low power consumption type MRAM capable of high-speed writing and reading.

In the write operation of MRAM, the magnetic characteristics of the ferromagnetic layers in the TMR element are desirably controlled. Stated more specifically, a technique for controlling the relative magnetization directions of two ferromagnetic layers sandwiching a non-magnetic layer to be parallel or antiparallel to each other and a technique for reversing the magnetization direction of one magnetic layer in a desired cell surely and efficiently are desired. A technique for controlling the relative magnetization directions of two ferromagnetic layers sandwiching a non-magnetic layer to be parallel or antiparallel to each other within the plane of a film by using two crossing wirings is disclosed in Patent Documents 1, 3 and 4, for example.

Patent Document 3 teaches that the memory cell of MRAM requires two crossing wiring layers, magnetic storage elements, transistor elements, and a coupling member for electrically coupling the magnetic storage elements and the transistor elements. Each of the magnetic storage elements has a recording layer which is ferromagnetic, a fixed layer and a non-magnetic layer sandwiched between the recording layer and the fixed layer.

When the cell is made small in size for higher integration in MRAM, a reversed magnetic field is grown by a diamagnetic field, depending on the size of the magnetic layer in the film surface direction. Thereby, a large magnetic field is required for writing, and consumption power also increases. Therefore, a technology for optimizing the shape of the ferromagnetic layer to facilitate the control of the magnetization direction is proposed as shown in Patent Documents 2, 5 and 6.

The control of the magnetization direction is selectively carried out for the recording layer of a specific magnetic storage element with a synthesized magnetic field generated by a current applied to two selected crossing wiring layers.

In recent years, there have been proposed a spin injection system for reversing the magnetization of a recording layer by injecting a spin polarized electron into the recording layer and a domain wall displacement system for controlling the magnetization direction by driving a domain wall formed in the region of the recording layer with a flow of a spin polarized electron (spin polarized current) as systems of controlling the magnetization direction, in addition to the above-described operation system using a wiring current magnetic field.

PRIOR ART DOCUMENTS

Patent Documents

[Patent Document 1] Japanese Unexamined Patent Publication No. Hei 11 (1999)-273337
[Patent Document 2] Japanese Unexamined Patent Publication No. 2002-280637
[Patent Document 3] Japanese Unexamined Patent Publication No. 2000-353791
[Patent Document 4] U.S. Pat. No. 6,005,800
[Patent Document 5] Japanese Unexamined Patent Publication No. 2004-296858

[Patent Document 6] U.S. Pat. No. 6,570,783
[Patent Document 7] Japanese Unexaminated Patent Publication No. 2005-310971
[Patent Document 8] Japanese Unexaminated Patent Publication No. 2005-340237
[Patent Document 9] Japanese Unexaminated Patent Publication No. 2004-200185

[Non-Patent Documents]

[Non-patent Document 1] D. H. Mosca et al., "Oscillatory interlayer coupling and giant magnetoresistance in Co/Cu multilayers", Journal of Magnetism and Magnetic Materials, 94 (1991), pp. L1-L5

[Non-patent Document 2] S. S. P. Parkin et al., "Oscillatory Magnetic Exchange Coupling through Thin Copper Layers", Physical Review Letters, vol. 66, No. 16, 22 Apr. 1991, pp. 2152-2155

[Non-patent Document 3] W. P. Pratt et al., "Perpendicular Giant Magnetoresistances of Ag/Co Multilayers", Physical Review Letters, vol. 66, No. 23, 10 Jun. 1991, pp. 3060-3063

[Non-patent Document 4] T. Miyazaki et al., "Giant magnetic tunneling effect in Fe/Al2O3/Fe junction" Journal of Magnetism and Magnetic Materials, 139 (1995), pp. L231-L234

[Non-patent Document 5] S. Tehrani et al., "High density submicron magnetoresistive random access memory (invited)", Journal of Applied Physics, vol. 85, No. 8, 15 Apr. 1999, pp. 5822-5827

[Non-patent Document 6] S. S. P. Parkin et al., "Exchange-biased magnetic tunnel junctions and application to nonvolatile magnetic random access memory (invited)", Journal of Applied Physics, vol. 85, No. 8, 15 Apr. 1999, pp. 5828-5833

SUMMARY OF THE INVENTION

In MRAM, as information is recorded by the magnetization direction of a recording layer in all of the above systems, the magnetization direction of the recording layer changes when the recording layer receives a disturbing magnetic field having a certain size or more from the outside no matter whether in operation or out of operation, thereby losing recorded information. Particularly during the operation of recording information, a magnetic field is generated in a direction into which the magnetization direction of the recording layer is to be reversed with a current flowing in a selected element and therearound. Therefore, in the same in-plane direction as the magnetization direction of the recording layer, the recording layer is affected even by a slight disturbing magnetic field from the outside, whereby an operation failure or the loss of recorded information is apt to occur. To solve this problem, the disturbing magnetic field in the memory cell region of MRAM must be reduced to 80 A/m (1 Oe) or less, that is, a geomagnetic level.

For example, Patent Documents 8 and 9 disclose a structure for shielding a memory cell from a disturbing magnetic field. In all the above documents, a 8 kA/m (100 Oe) or larger disturbing magnetic field which can be generated normally cannot be reduced to a geomagnetic level in the inside of the memory cell, and it cannot be said that the above structure is a satisfactory magnetic shielding structure.

It is an object of the present invention which has been made in view of the above problem to provide a magnetic storage device which enables the stable operation of MRAM at the time of recording information and the stable retention of recorded information.

The magnetic storage device of the present invention has a die, second and third magnetic shielding structures and a lead frame member. The die has a substrate, first and second wirings, a magnetic storage element and a first magnetic shielding structure. The first wiring is formed over the substrate and has a part extending in one direction. The second wiring is formed over the substrate, intersects the first wiring in a plan view and is separate from the first wiring in the thickness direction of the substrate. At least part of the magnetic storage element is sandwiched between the first and second wirings in a region where the first and second wirings intersect each other with a space therebetween. The first shielding structure is formed to cover the magnetic storage element in a plan view. The second and third magnetic shielding structures sandwich the die in the thickness direction. The lead frame member has the die mounted thereon and contains a ferromagnetic material. The lead frame member overlaps with only part of the die in a plan view.

According to the magnetic storage device of the present invention, a disturbing magnetic field in the same in-plane direction as the magnetization direction of the recording layer is suppressed to enable the stable operation of recording information and the retention of recorded information.

BRIEF DESCRIPTION OF THE DRAWINGS

FIG. 2 is a schematic sectional view of the MRAM die of the magnetic storage device according to the embodiment of the present invention;

FIG. 3 is a schematic sectional view of the magnetic storage element of the magnetic storage device according to the embodiment of the present invention;

FIGS. 4(A) to 4(C) show the configuration of the magnetic storage device according to the embodiment of the present invention, in which FIG. 4(A) is a schematic plan view, FIG. 4(B) is a schematic sectional view along the line IVB-IVB of FIG. 4(A) and FIG. 4(C) is a partially enlarged view of FIG. 4(B);

FIGS. 6(A) and 6(B) show the layout of an MRAM die, two magnetic shielding plates and a die pad in the embodiment of the present invention, in which FIG. 6(A) is a schematic plan view and FIG. 6(B) is a schematic sectional view of one of the magnetic shielding plates along the line VIB-VIB of FIG. 6(A);

FIG. 7 is a schematic sectional view of the first step in the process of manufacturing the MRAM die of the magnetic storage device according to the embodiment of the present invention;

FIGS. 12 (A) to 12(C) show the layout of the memory cell region of the magnetic storage device according to the embodiment of the present invention, in which

DETAILED DESCRIPTION OF THE PREFERRED EMBODIMENTS

An embodiment of the present invention will be described hereinbelow with reference to the accompanying drawings.
(Circuit and Structure of Memory Cell)

A description is first given of the circuit of the memory cell of a magnetic storage device according to the embodiment of the present invention.

Figure 1:
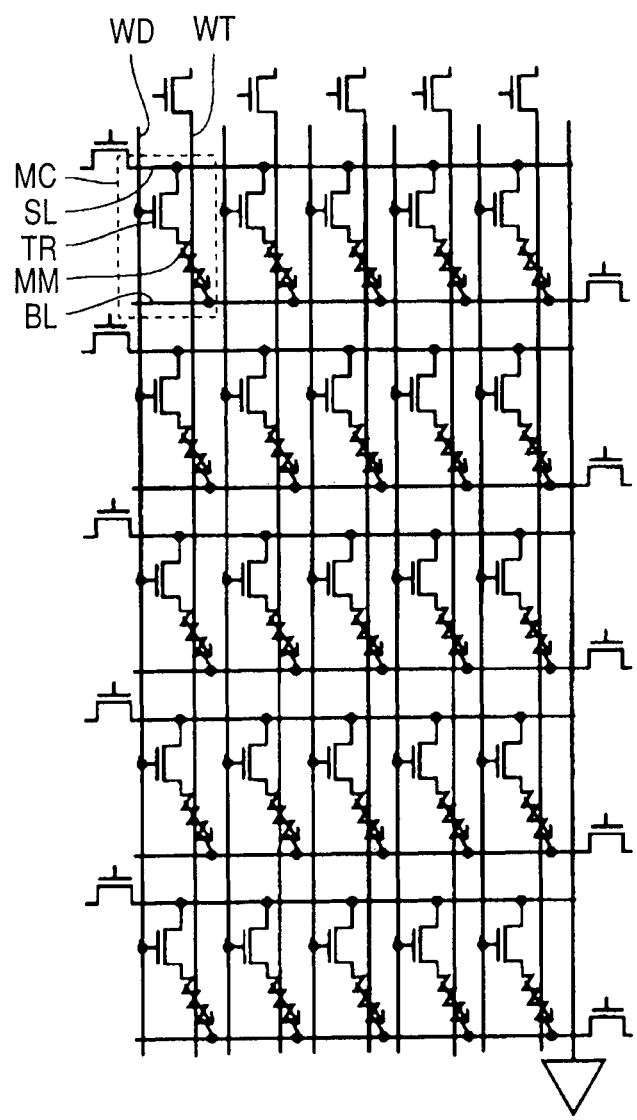
FIG. 1 is a circuit diagram of the memory cell of a magnetic storage device according to an embodiment of the present invention.

With reference to FIG. 1, in the magnetic storage device, one memory cell MC (enclosed by a dotted line) comprises an element selection transistor TR and a magnetic storage element (ferromagnetic tunnel junction element) MM. The memory cells MC are arranged in a matrix.

A write line WT and a bit line BL (first and second wirings) for writing and reading information intersect each other for the magnetic storage element MM. The write line WT extends along the magnetic storage elements MM arranged in one direction (for example, a column) but not electrically coupled to the magnetic storage elements MM. In MRAM in which the magnetization direction is controlled by a spin polarized electron, WT itself is not necessary. The bit line BL is electrically coupled to one end of each of the magnetic storage elements MM arranged in the other direction (for example, a row).

The other end of the magnetic storage element MM is electrically coupled to the drain side of the element selection transistor TR. The gates of the element selection transistors TR arranged in one direction are electrically coupled to one another by a word line WD which intersects the bit lines BL. The source sides of the element selection transistors TR arranged in the other direction are electrically coupled to a source line SL.

A description is subsequently given of the structure of the memory cell of the magnetic storage device in this embodiment.

With reference to FIG. 2, in the memory cell region MR of a semiconductor substrate 11, the element selection transistor TR is formed over the surface (surface of the semiconductor substrate 11) of an element forming region partitioned by an element separation insulating film 12. The element selection transistor TR has a drain region D, a source region S and a gate electrode body G as the main components. The drain region D and the source region S are formed in the surface of the semiconductor substrate 11 at a predetermined interval. The drain region D and the source region S are each composed of a predetermined conductive type impurity region. The gate electrode body G is formed in a region sandwiched between the drain region D and the source region S through a gate insulating film GI. The side wall of the gate electrode body G is covered with a side-wall insulating film SI.

An interlayer insulating film 13 is formed to cover the element selection transistor TR. A hole reaching the drain region D is formed in this interlayer insulating film 13 from the top. A coupling member 14 is formed in this hole. An interlayer insulating film 15 is formed over the interlayer insulating film 13. A hole reaching the coupling member 14 and a hole reaching the interlayer insulating film 13 are formed in this interlayer insulating film 15 from the top. The write line WT and a coupling member 16 are formed in these holes, respectively. The coupling member 16 is electrically coupled to the drain region D by the coupling member 14. In MRAM in which the magnetization direction is controlled by a spin polarized electron, the write line WT may not be formed.

An interlayer insulating film 17 is formed over the interlayer insulating film 15 to cover the write line WT and the coupling member 16. A hole reaching the coupling member 16 is formed in this interlayer insulating film 17 from the top. A coupling member 18 is formed in this hole. A conductive layer 19 and a magnetic storage element MM are formed over the interlayer insulating film 17. The conductive layer 19 is electrically coupled to the drain region D by the coupling members 18, 16 and 14. FIG. 2 shows that the magnetic storage element MM is arranged above the write line WT. However, this arrangement is not always adopted in the system in which the write line WT is not necessary, for example, MRAM in which the magnetization direction is controlled by a spin polarized electron.

The magnetic storage element MM is a magnetoresistive effect element and has a fixed layer 1, a tunnel insulating layer 2 which is a non-magnetic layer and a recording layer 3 from the bottom as shown in FIG. 3. The fixed layer 1 is formed in contact with the conductive layer 19. In the fixed layer 1, the magnetization direction is fixed. In the recording layer 3, the magnetization direction is changed by a magnetic field generated with a current flowing into a predetermined wiring (for example, the bit line BL) or the injection of a spin polarized electron.

A protective film 20 and/or an interlayer insulating film 21 are/is formed to cover the magnetic storage element MM. When the protective film 20 is used, an interlayer insulating film 21 is formed over the protective film 20. A hole reaching the recording layer 3 through these films 20 and 21 is formed in the protective film 20 and the interlayer insulating film 21. A coupling member 23 is formed in this hole. The bit line BL is formed over the interlayer insulating film 21. This bit line BL is electrically coupled to the magnetic storage element MM by the coupling member 23.

Further, an interlayer insulating film 26 is formed to cover the bit line BL. A magnetic shielding layer 101 (first magnetic shielding structure) composed of a soft magnetic thin film is formed over the interlayer insulating film 26.

In a logic circuit region RR, a transistor TRA configuring a logic circuit is formed. This transistor TRA has a pair of source/drain regions S/D formed in the surface of the semiconductor substrate 11 at a predetermined interval and a gate electrode G formed in a region sandwiched between the pair of source/drain regions S/D through a gate insulating film GI. The side wall of the gate electrode G is covered with a side wall insulating film SI.

Predetermined wiring layers 16, 25 and 29, coupling members 14, 23 and 27 for electrically coupling the wiring layers 16, 25 and 29, and interlayer insulating films 13, 15, 17, 21, 24, 26 and 28 are formed over this transistor TRA.

(Operation of Memory Cell)

A description is subsequently given of the operation of the memory cell, taking the structure shown in FIG. 2 as an example.

With reference to FIG. 2, read operation is carried out by applying a predetermined current to the magnetic storage element MM of a specific memory cell to detect the difference in resistance value according to the magnetization direction. First, the selection transistor TR of the specific memory cell is turned on to apply a predetermined sense signal to the source line SL from the bit line BL through the specific magnetic storage element MM, the coupling members 18, 16 and 14 and the selection transistor TR.

At this point, when the magnetization directions of the recording layer 3 and the fixed layer 1 in the magnetic storage element MM are the same (parallel), the resistance value is relatively low and when the magnetization directions of the recording layer 3 and the fixed layer 1 are opposite (antiparallel), the resistance value is relatively high. The resistance value of the tunnel magnetoresistive effect element becomes small when the magnetization directions of the recording layer 3 and the fixed layer 1 are parallel to each other and becomes large when the magnetization directions of the recording layer 3 and the fixed layer 1 are antiparallel to each other.

Thereby, when the magnetization direction of the magnetic storage element MM is parallel, the intensity of a sense signal flowing in the source line SL becomes higher than the intensity of the signal of a predetermined reference memory cell. Meanwhile, when the magnetization direction of the magnetic storage element MM is antiparallel, the intensity of the sense signal becomes lower than that of the predetermined reference memory cell. Thus, it is judged whether information written in the specific memory cell is "0" or "1" based on whether the intensity of the sense signal is higher or lower than the signal intensity of the predetermined reference memory cell.

The write (rewrite) operation is carried out by applying a predetermined current to the bit line BL and the write line WT to magnetize (reversal of magnetization) the magnetic storage element MM. First, by applying a predetermined current to the selected bit line BL and the selected write line WT, a magnetic field is generated around the bit line BL and the write line WT in the direction of the current flow. A combined magnetic field of a magnetic field generated by a current flowing in the bit line BL and a magnetic field generated by a current flowing in the write line WT is applied to the magnetic storage element MM located in a region where the selected bit line BL and the selected write line WT intersect each other.

At this point, the recording layer 3 of the magnetic storage element MM is magnetized in the same direction as the magnetization direction of the fixed layer 1 or in an opposite direction to the magnetization direction of the fixed layer 1 according to the combined magnetic field. Thus, when the magnetization directions of the recording layer 3 and the fixed layer 1 are the same (parallel to each other) or opposite (antiparallel to each other), the direction of this magnetization is recorded as "0" or "1".

(Structure of Magnetic Storage Device)

Figure 4A:
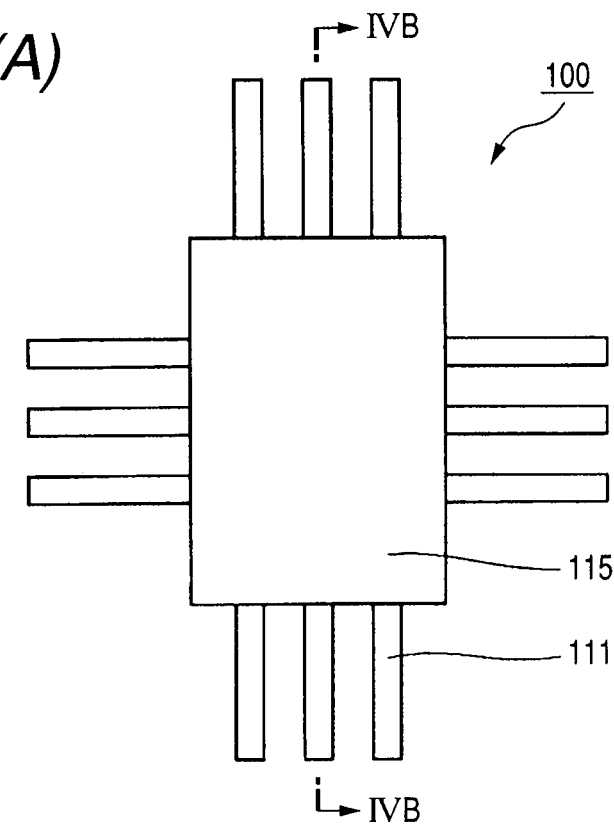
Figure 4B:
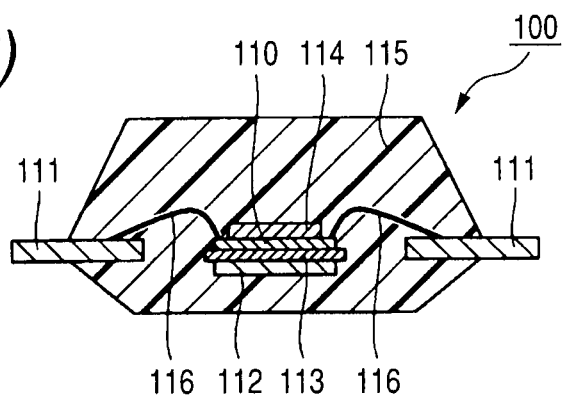
Figure 5:
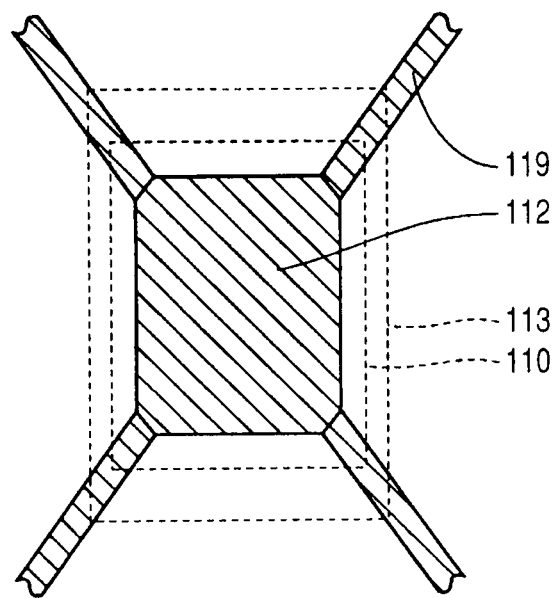
FIG. 5 is a partially schematic plan view of the lead frame member of the magnetic storage device according to the embodiment of the present invention.

With reference to FIG. 4(A) and FIG. 4(B), the magnetic storage device 100 of this embodiment comprises a mold package 115 (mold structure), a die pad 112, leads 111, wires 116, an MRAM die 110 having the above memory cell structure and magnetic shielding plates 113 and 114 (second and third magnetic shielding structures). The die pad 112 is a part where the MRAM die 110 is mounted of a lead frame member shown in FIG. 5.

The mold package 115 is made of a sealing resin and seals a structure including the MRAM die 110.

The die pad 112 and the leads 111 are metal members. These metal members are made of a ferromagnetic material such as Fe, Ni or Co, or an alloy material comprising any one of these ferromagnetic materials as the main component and may be coated with another metal material. Alternatively, these metal members may be made of a non-magnetic material such as Cu and may be coated with any one of the above ferromagnetic materials or alloy material. Thereby, the die pad 112 can obtain a magnetic shielding effect. The leads 111 are electrically coupled to bonding pads (not shown) over the MRAM die 110 by the wires 116 and extend outward from the inside of the mold package 115.

Figure 6A:
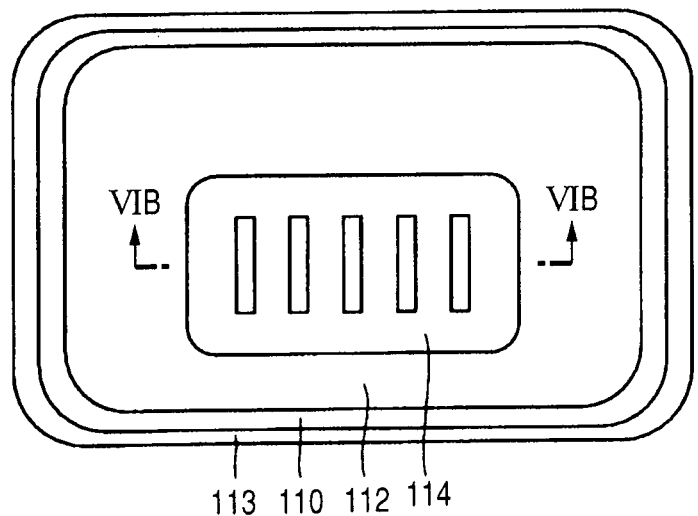

The magnetic shielding plate 113 is arranged over the die pad 112. The MRAM die 110 is arranged over the magnetic shielding plate 113. As shown in FIG. 6(A), the size of the die pad 112 which is a lead frame member is smaller than the size of the MRAM die 110. Therefore, the die pad 112 and die pad supports 119 both of which configure the lead frame member overlap with only part of the MRAM die 110 in a plan view and the other part of the MRAM die 110 is exposed from the lead frame member in a plan view.

If the magnetic shielding plate 113 is larger in size than the memory cell region MR of the MRAM die 110 (FIG. 2), there will be no problem. However, from the viewpoint of stable adhesion to the MRAM die 110, the magnetic shielding plate 113 is made larger than the MRAM die 110.

The magnetic shielding plate 114 is arranged over the MRAM die 110. The MRAM die 110 is sandwiched between the magnetic shielding plates 113 and 114 in the thickness direction, mounted over the die pad 112 and sealed by the mold package 115.

Figure 4C:
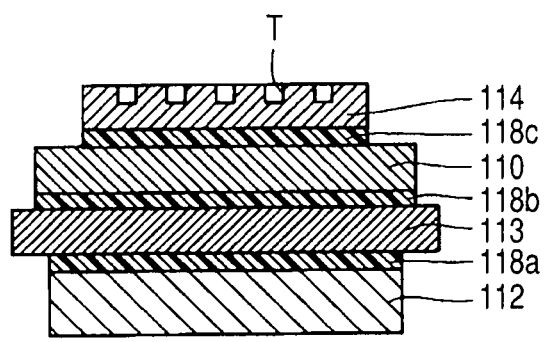

Further, with reference to FIG. 4(C), more specifically, an adhesion layer 118a is formed between the die pad 112 and the magnetic shielding plate 113. An adhesion layer 118b is formed between the magnetic shielding plate 113 and the MRAM die 110. An adhesion layer 118c is also formed between the MRAM die 110 and the magnetic shielding plate 114.

Figure 6B:
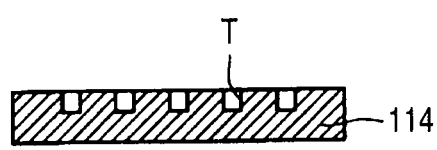

With reference to FIG. 6(A), the size of the magnetic shielding plate 114 is made smaller than the size of the MRAM die 110 and larger than the size of the memory cell region MR (FIG. 2). As shown in FIG. 6(B), the top surface of the magnetic shielding plate 114 is made uneven (texture structure T). This uneven surface enhances adhesive force between the magnetic shielding plate 114 and the mold package 115 (FIG. 4(B)).

The material used in the magnetic shielding plates 113 and 114 is preferably a soft magnetic material having a high magnetic permeability and a high saturation magnetic flux density. It is, for example, an alloy material comprising a ferromagnetic material such as Fe, Ni or Co as the main component, as exemplified by permalloy and soft ferrite materials.

A description is subsequently given of an example of the process of manufacturing the above-described memory cell structure and the above-described magnetic storage device.
(Process of Manufacturing Memory Cell Structure)

With reference to FIG. 7, the memory cell region MR and a peripheral circuit region RR are produced by forming the element separation insulating film 12 in predetermined regions of the main surface of the semiconductor substrate 11. The gate electrode body G is formed over the surface of the semiconductor substrate 11 located in the memory cell region MR and the peripheral circuit region RR through the gate insulating film GI. The drain region D, the source region S and the pair of source/drain regions S/D which are impurity regions are formed by introducing a predetermined conductive impurity into the surface of the semiconductor substrate 11 with the gate electrode body G as a mask. Thus, the element selection transistor TR including the gate electrode G, the drain region D and the source region S is formed in the memory cell region MR, and the transistor TRA configuring a logic circuit is formed in the peripheral circuit region RR.

The interlayer insulating film 13 is formed to cover the element selection transistor TR and the transistor TRA by CVD (Chemical Vapor Deposition), for example. Predetermined photoengraving and etching are carried out on the interlayer insulating film 13 to form contact holes 13a and 13b for exposing the surface of the semiconductor substrate 11 therefrom. A tungsten layer (not shown) is formed over the interlayer insulating film 13 to fill these contact holes 13a and 13b. The tungsten layer on the top surface of the interlayer insulating film 13 is removed by carrying out CMP (Chemical Mechanical Polishing) on the tungsten layer.

Figure 8:
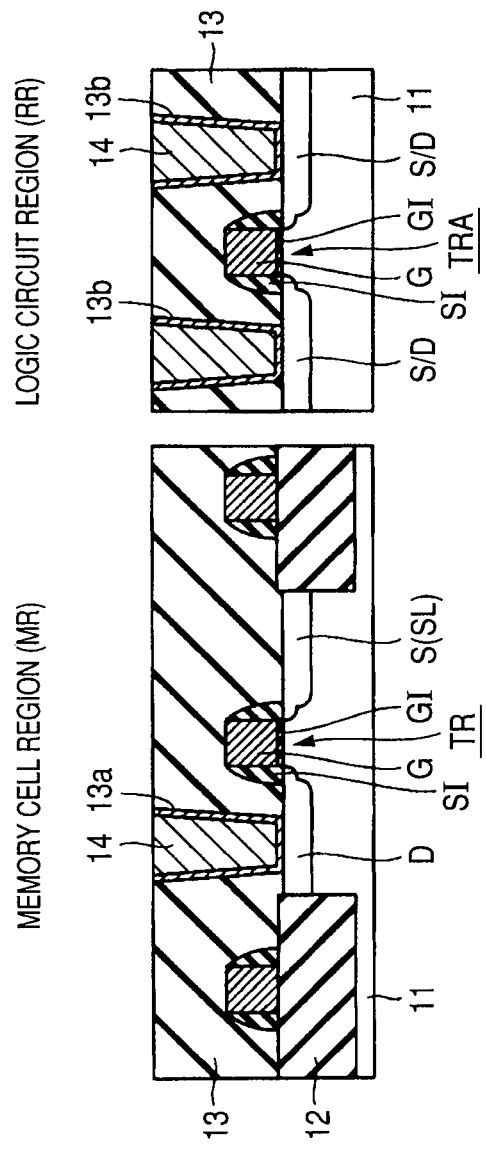
FIG. 8 is a schematic sectional view of the second step in the process of manufacturing the MRAM die of the magnetic storage device according to the embodiment of the present invention.

With reference to FIG. 8, the tungsten layer remains in the contact holes 13a and 13b by the removal of the tungsten layer to form the coupling members 14.

Figure 9:
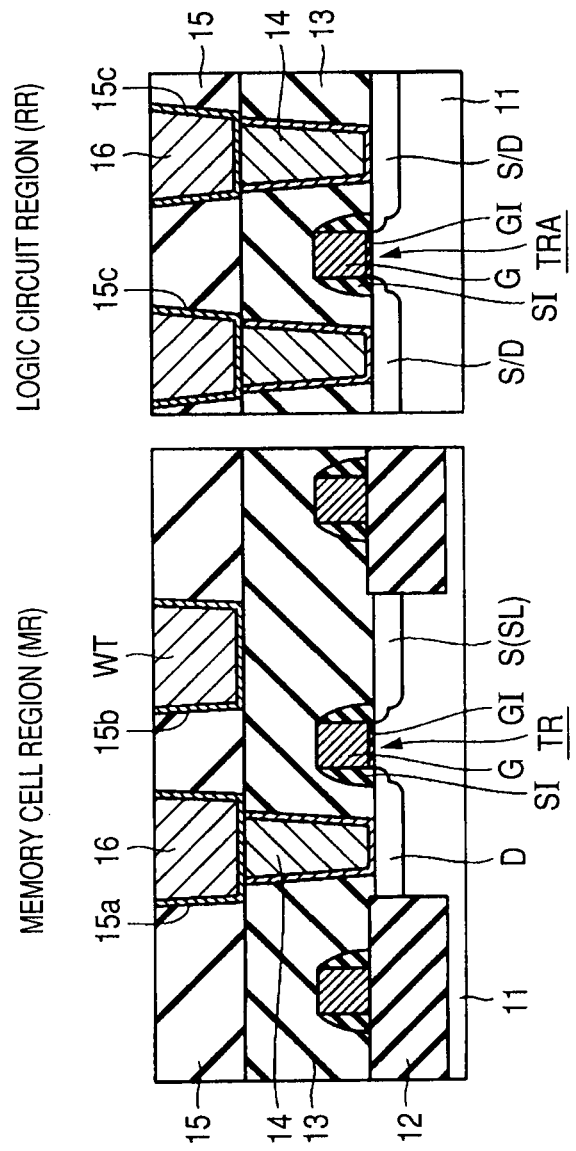
FIG. 9 is a schematic sectional view of the third step in the process of manufacturing the MRAM die of the magnetic storage device according to the embodiment of the present invention.

With reference to FIG. 9, the interlayer insulating film 15 is further formed over the interlayer insulating film 13 by CVD, for example. Predetermined photoengraving and etching are carried out on the interlayer insulating film 15 to form openings 15a and 15b for forming a write line and a predetermined wiring layer therein in the memory cell region MR. In the peripheral circuit region RR, openings 15c for forming a predetermined wiring layer therein is formed in the interlayer insulating film 15. A copper layer (not shown) is formed over the interlayer insulating film 15 to fill the openings 15a, 15b and 15c. The copper layer on the top surface of the interlayer insulating film 15 is removed by carrying out CMP on the copper layer so that the copper layer remains in the openings 15a, 15b and 15c. Thereby, the write line WT is formed in the opening 15b and the wiring layer 16 is formed in the opening 15a in the memory cell region MR. The wiring layer 16 is formed in the openings 15c in the peripheral circuit region RR.

For the formation of the copper layer which fills the openings 15a, 15b and 15c, a reaction prevention layer for preventing a reaction between the copper layer and the interlayer insulating film may be formed. Further, at the time of forming the write line WT, the copper layer may be assembled with a film having a high magnetic permeability to collect a wiring current magnetic field in a predetermined magnetic storage element.

Figure 10:
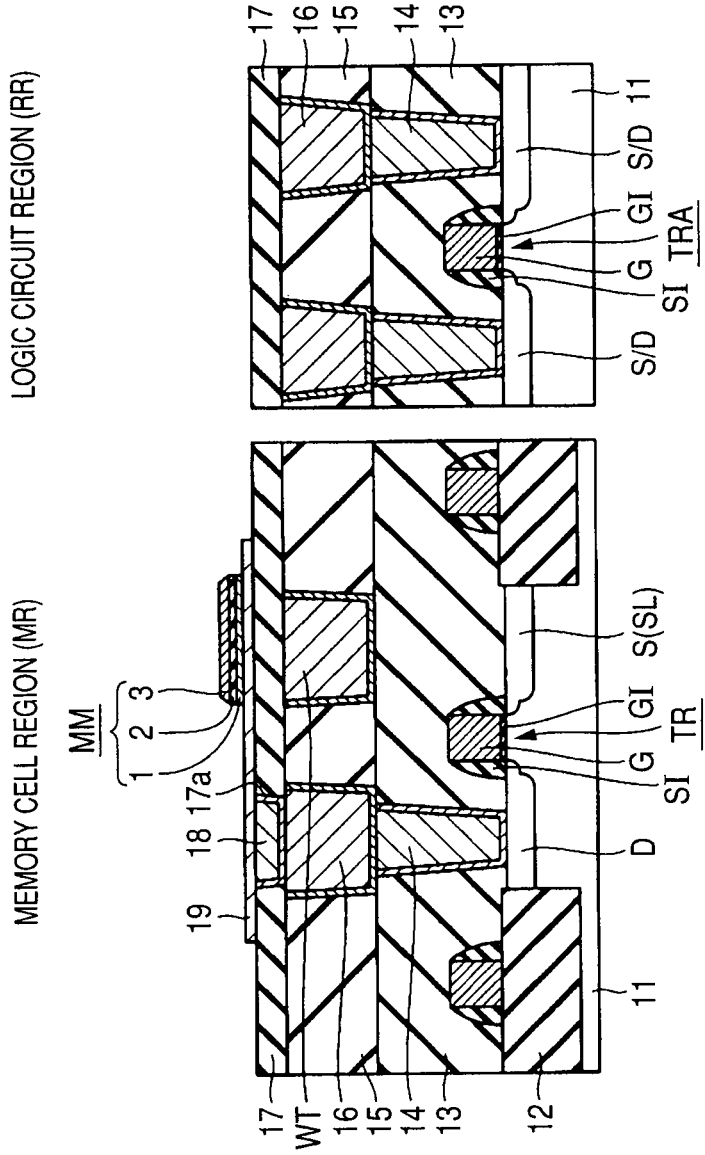
FIG. 10 is a schematic sectional view of the fourth step in the process of manufacturing the MRAM die of the magnetic storage device according to the embodiment of the present invention.

With reference to FIG. 10, the interlayer insulating film 17 is further formed over the interlayer insulating film 15 by CVD, for example. A contact hole 17a for exposing the surface of the wiring layer 16 therefrom is formed by carrying out predetermined photoengraving and etching on the interlayer isolating film 17. A copper layer (not shown) is formed over the interlayer insulating film 17 to fill the contact hole 17a. The copper layer on the top surface of the interlayer insulating film 17 is removed by carrying out CMP on the copper layer so that the copper layer remains in the contact hole 17a to form the coupling member 18.

Then, the conductive layer 19 and the magnetic storage element MM are formed over the interlayer insulating film 17 in the memory cell region MR. The magnetic storage element MM is a laminated film comprising the fixed layer 1, the tunnel insulating layer 2 and the recording layer 3. First, as a film which will become the fixed layer 1, a precious metal-manganese alloy film (antiferromagnetic layer) and a cobalt alloy film (ferromagnetic layer) are formed sequentially. A platinum-manganese film having a thickness of 7 to 30 nm or an iridium-manganese film having a thickness of 2 to 15 nm is formed as an example of the precious metal-manganese alloy film and then a cobalt-iron alloy film (ferromagnetic layer) having a thickness of 0.5 to 5 nm is formed as an example of the cobalt alloy film. An aluminum oxide film is then formed as an example of the tunnel insulating layer 2 having a thickness of 0.3 to 5 nm. A nickel alloy film having a thickness of 1 to 5 nm and/or a cobalt alloy film (both are not shown) are/is then formed as an example of the recording layer 3. These films are formed by sputtering, for example.

Thereafter, predetermined photoengraving and etching are carried out to form the magnetic storage element MM having a predetermined shape and comprising the fixed layer 1, the tunnel insulating layer 2 and the recording layer 3. In general, when a dry process (ashing) is used for the removal of a resist pattern after etching, a gas comprising oxygen as the main component is used. However, when a non-oxidizing gas such as hydrogen, nitrogen or ammonia gas or a mixed gas thereof which is not an oxidizer for the constituent materials of the fixed layer 1 and the recording layer 3 is used, the oxidation of the fixed layer 1 and the recording layer 3 is suppressed.

As for etching, dry etching is employed. More specifically, for example, ion beam etching may be employed. In this method, an ion beam of an inert gas such as Ar (argon) is applied at an angle inclined from the normal of the substrate surface of the semiconductor substrate 11. At this point, the semiconductor substrate 11 is turned while the normal direction of the substrate surface is maintained. Alternatively, RIE (Reactive Ion Etching) using a reactive gas containing Cl (chlorine) or CO (carbon monoxide) may be employed.

The fixed layer 1 may have a laminate structure consisting of an antiferromagnetic layer, a ferromagnetic layer, a non-magnetic layer and a ferromagnetic layer. The recording layer 3 may have a laminate structure consisting of ferromagnetic layers having different magnetic properties or a laminate structure consisting of a ferromagnetic layer, a non-magnetic layer and a ferromagnetic layer.

Figure 11:
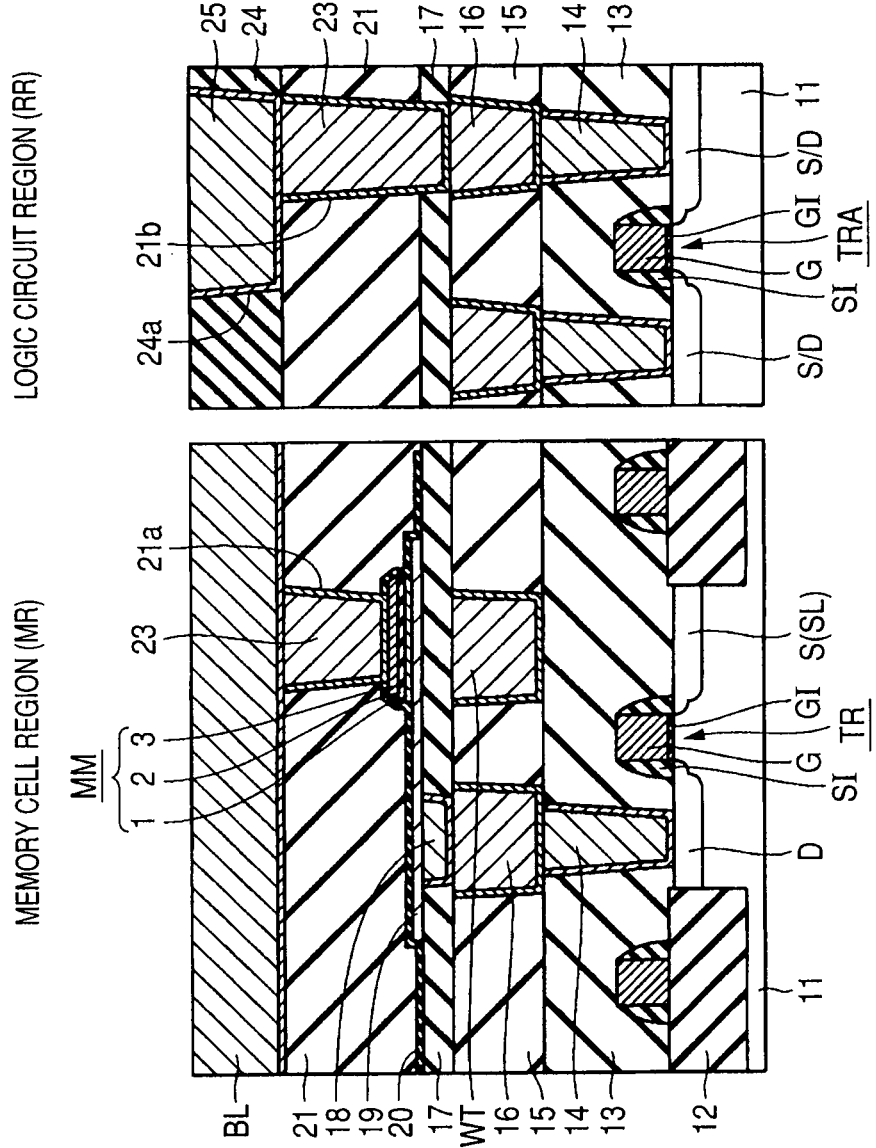
FIG. 11 is a schematic sectional view of the fifth step in the process of manufacturing the MRAM die of the magnetic storage device according to the embodiment of the present invention.

With reference to FIG. 11, the protective film 20 is formed to cover the magnetic storage element MM so that it is not damaged by the subsequent process. The interlayer insulating film 21 is further formed over the interlayer insulating film 17 by CVD, for example, to cover the protective film 20. In the memory cell region MR, predetermined photoengraving and etching are carried out on the interlayer insulating film 21 and the protective film 20 to form a contact hole 21a for exposing the surface of the recording layer 3 therefrom. In the peripheral circuit region RR, predetermined photoengraving and etching are carried out on the interlayer insulating film 21 and the interlayer insulating film 17 to form a contact hole 21b reaching the surface of the wiring layer 16. A copper layer (not shown) is formed over the interlayer insulating film 21 to fill these contact holes 21a and 21b. The copper layer over the top surface of the interlayer insulating film 21 is removed by carrying out CMP on the copper layer so that the copper layer remains in the contact holes 21a and 21b to form the coupling members 23.

The interlayer insulating film 24 is further formed over the interlayer insulating film 21 by CVD, for example, to cover the interlayer insulating film 21. Predetermined photoengraving and etching are carried out on the interlayer insulating film 24 to form an opening for forming a bit line in the interlayer insulating film 24 in the memory cell region MR and an opening 24a in the interlayer insulating film 24 in the peripheral circuit region RR. A copper layer (not shown) is formed over the interlayer insulating film 24 to fill these openings. The copper layer over the top surface of the interlayer insulating film 24 is removed by carrying out CMP on the copper layer so that the copper layer remains in the opening for the bit line so as to form the bit line BL and also remains in the opening 24a so as to form the wiring layer 25.

Although the single damascene process has been described above, after the formation of the interlayer insulating film 21, the interlayer insulating film 24 is further formed and the dual damascene process may be employed to form predetermined coupling members and wiring layers in these interlayer insulating films 21 and 24. In this case, the opening (not shown) for forming a bit line is formed in the memory cell region MR by carrying out predetermined photoengraving and etching on the interlayer insulating film 24. In the peripheral circuit region RR, the opening 24a for forming a wiring layer is formed. Then, the contact hole 21a reaching the surface of the recording layer 3 of the magnetic storage element MM is formed in the memory cell region MR by carrying out predetermined photoengraving and etching on the interlayer insulating film 21. In the peripheral circuit region RR, the contact hole 21b reaching the surface of the wiring layer 16 is formed. After the contact holes are formed in the interlayer insulating films 21 and 24, the opening 24a may be formed in the interlayer insulating film 24.

Then, a copper layer (not shown) is formed over the interlayer insulating film 24 to fill the contact holes 21a and 21b and the opening 24a. The copper layer over the top surface of the interlayer insulating film 24 is removed by carrying out CMP, for example, on the copper layer. Thereby, in the memory cell region MR, the coupling member 23 electrically coupled to the recording layer 3 is formed by filling the contact hole 21a and the bit line BL electrically coupled to the coupling member 23 is formed in the opening. If the bit line BL and the recording layer 3 can be electrically coupled to each other without using the coupling member 23, there will be no problem. Meanwhile, in the peripheral circuit region RR, the coupling member 23 electrically coupled to the wiring layer 16 is formed in the contact hole 21b and the wiring layer 25 electrically coupled to the coupling member 23 is formed in the opening 24a.

With reference to FIG. 2, the interlayer insulating film 26 is formed to cover the bit line BL and the wiring layer 25 formed above, and further the magnetic shielding layer 101 having a thickness of 10 to 100 nm composed of a nickel alloy film is formed by sputtering. Since the disturbing magnetic field is introduced into the inside of the magnetic shielding layer 101, the memory cell is not affected by the disturbing magnetic field. The magnetic shielding layer 101 is preferably made of a material having a high magnetic permeability and a high saturation magnetic flux density, for example, a ferromagnetic material such as Fe, Ni or Co, or an alloy material comprising any one of them as the main component, more preferably a permalloy or soft ferrite material.

Figure 12A:
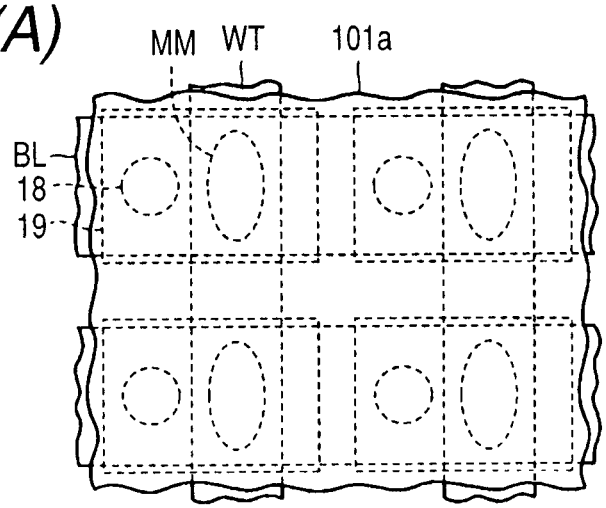
FIG. 12(A) is a schematic partial plan view.
Figure 12B:
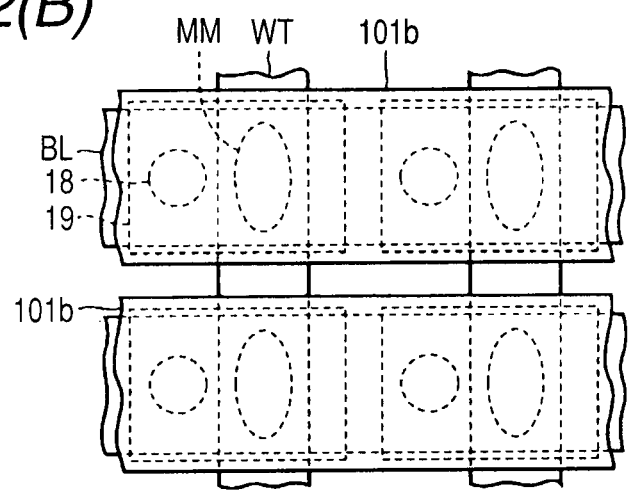
FIG. 12(B) is a diagram of a first modification thereof.
Figure 12C:
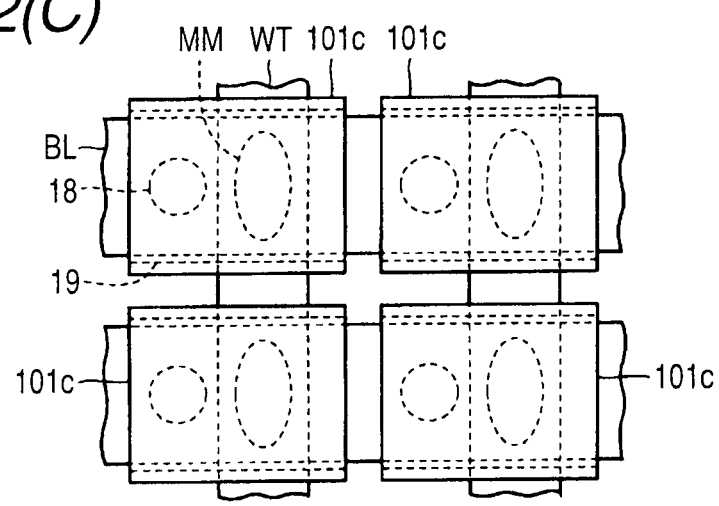
FIG. 12(C) is a diagram of a second modification thereof.

The magnetic shielding layer 101 is formed to cover at least the magnetic storage element MM in a plan view like the magnetic shielding layers 101a to 101c as shown in FIGS. 12(A) to 12(C) and continuous over the whole memory cell region MR (FIG. 12(A)). Alternatively, it may be an assembly of small magnetic shielding layers (FIG. 12(B) or (C)). Further, the magnetic shielding layer 101 may have a multi-layer film structure that multiple layers are formed with a dielectric material or a conductive material therebetween.

In FIG. 12(B), the magnetic shielding layer 101b extends in the extension direction of the bit line BL but may extend in the extension direction of the write line WT.

In the above-described process of manufacturing a magnetic storage device, a tungsten layer is used as the coupling member 14. Silicon may be used to form the coupling member 14. Or, a metal such as copper, titanium or tantalum may be used. Further, alloys of these metals and nitrides of these metals may also be used. CMP or RIE is used to form the coupling member 14 but plating, sputtering or CVD may be employed. When copper is used as the metal, so-called "damascene process" may be employed and the wiring layers can be formed parallel to the coupling member 14.

The single damascene process has been described as the method of forming the write line WT. When the write line WT is formed at the same time as the coupling member 14, the dual damascene process may be employed. Further, the formation of wirings by dry etching is made possible by using a metal such as silicon, tungsten, aluminum or titanium, or an alloy or compound thereof as the wiring material.

Although the thickness of each of the interlayer insulating films interposed between the wiring layers differs by each application device, it is, for example, about 40 nm in this magnetic storage device.

Aluminum oxide is used as the material of the tunnel insulating layer 2 of the magnetic storage element MM but a non-magnetic material is preferred as the material of the tunnel insulating layer 2. For example, an oxide of a metal such as aluminum, silicon, tantalum, magnesium, titanium, hafnium, yttrium or lanthanum, a nitride of any one of these metals, a metal alloy oxide typified by silicate or a nitride of the alloy is preferred as the material of the tunnel insulating layer 2. The tunnel insulating layer 2 is preferably formed as a relatively thin film having a thickness of 0.3 to 5 nm. When a non-magnetic metal material is used in place of the tunnel insulating layer 2, a so-called "giant magnetoresistive effect" in the direction perpendicular to the surface of the film can also be used.

Although a laminate structure consisting of a platinum-manganese alloy film or an iridium-manganese alloy film and a cobalt-iron alloy film is given as an example of the fixed layer 1 and a laminate structure consisting of a nickel alloy film and a cobalt alloy film is given as an example of the recording layer 3 of the magnetic storage element MM, the fixed layer 1 and the recording layer 3 are preferably made of a ferromagnetic material comprising nickel, iron and/or cobalt as the main components. Further, for the improvement of the magnetic properties and thermal stability of the ferromagnetic material, an additive such as boron, nitrogen, silicon, molybdenum, zirconium, copper, tantalum or ruthenium may be introduced into the ferromagnetic material. It is possible to improve the magnetic properties and stability of the recording layer 3 by forming a crystalline material thin film having a body-centered cubic type, rutile type, sodium chloride type or sphalerite type crystal structure and/or forming an oxidation prevention film made of tantalum or ruthenium over the recording layer 3. Further, so-called "half metal" such as NiMnSb, $Co_2Mn(Ge,Si)$, $Co_2Fe(Al, Si)$ or $(Zn,Mn)Fe_2O_4$ may also be used. Since an energy gap is existent in one spin band in the half metal, a very large magnetic effect can be obtained with the result that a large signal output can be obtained.

The magnetization direction of the fixed layer 1 can be fixed by forming it as a laminate structure comprising an antiferromagnetic layer and a ferromagnetic layer. That is, the antiferromagnetic layer fixes the direction of the spin of the ferromagnetic layer so as to keep constant the magnetization direction of the ferromagnetic layer. The antimagnetic layer is preferably made of a compound comprising at least one ferromagnetic material or precious metal and manganese.

In the above-described manufacturing process, the fixed layer 1, the tunnel insulating layer 2 and the recording layer 3 of this magnetic storage element are formed by sputtering. However, the fixed layer 1, the tunnel insulating layer 2 and the recording layer 3 may be formed by MBE (Molecular Beam Epitaxy), chemical vapor growth or deposition besides sputtering.

In the above-described process of manufacturing a magnetic storage device, the conductive layer 19 is existent between the fixed layer 1 and the coupling member 18 of the magnetic storage element MM. The fixed layer 1 and the coupling member 18 may not be directly coupled to each other. The wiring layer 16 and the conductive layer 19 may be directly coupled to each other without using the coupling member 18. In this case, the conductive layer 19 may be formed to have the same shape as the planar shape of the fixed layer 1 so that it overlaps with the fixed layer 1 in a plan view. Preferred examples of the material of the conductive layer 19 include low-resistance metals such as platinum, ruthenium, copper, aluminum, tantalum, chromium, alloys thereof and nitrides thereof. The thickness of the conductive layer 19 is preferably 300 nm or less so that the flatness of each of the fixed layer 1, the tunnel insulating layer 2 and the recording layer 3 formed over the conductive layer is not impaired.

The fixed layer 1 and the recording layer 3 do not need to be the same in size in a plan view, and the fixed layer 1 may be larger in size than the recording layer 3. When the fixed layer 1 is coupled to the coupling member 14 through the conductive layer 19, if the conductive layer 19 is formed larger than the fixed layer 1 in a plan view, there will be no problem with the magnetic storage element.

When the coupling member 18 is made of copper, for example, by interposing the predetermined conductive layer 19 between the interlayer insulating film 15 and the magnetic storage element MM and the magnetic storage element MM is patterned by etching, the corrosion of the copper coupling member 18 can be prevented. When a material having a lower resistance than the resistance of the fixed layer 1 of the magnetic storage element MM is used as the material of the conductive layer 19, the resistance of a current pathway for reading can be reduced and the read speed can be improved.

Further, in the above-described magnetic storage device of this embodiment, to prevent the magnetic storage element MM from being damaged in the subsequent step after the formation of the magnetic storage element MM, the protective film 20 is formed to cover the magnetic storage element MM. Possible damage to the magnetic storage element MM in the manufacturing process is, for example, a heat treatment for forming the interlayer insulating films. When a silicon oxide film is formed as the interlayer insulating films, it is formed at about 400° C. in an oxidative atmosphere.

At this point, the magnetic film may be oxidized in the oxidative atmosphere, whereby the magnetic properties of the magnetic storage element MM may deteriorate. By covering the magnetic storage element MM with the protective film 20 such as a silicon nitride film or an aluminum oxide film, the protective film 20 serves as a barrier for this oxidation to protect the magnetic storage element MM.

To prevent this oxidation, the interlayer insulating films may have a double-layer structure consisting of a thin film which can be formed in a non-oxidative atmosphere, such as a silicon nitride film, and an oxidative insulating film. In this case, the silicon nitride film of each of the interlayer insulating films having a double-layer structure becomes a protective film for the magnetic storage element MM.

Further, the protective film 20 is preferably a film containing at least one material selected from insulating metal nitrides, insulating metal carbides and metal oxides formed by the oxidation of a metal having a lower oxide forming free energy than Fe. By using this material, the oxidation of the magnetic storage element MM in the oxidation step of the process of manufacturing a magnetic storage device comprising a magnetic material thin film containing at least Fe can be suppressed. As a result, a magnetic storage device which can be easily manufactured and has stable operation characteristics can be obtained.

Figure 13:
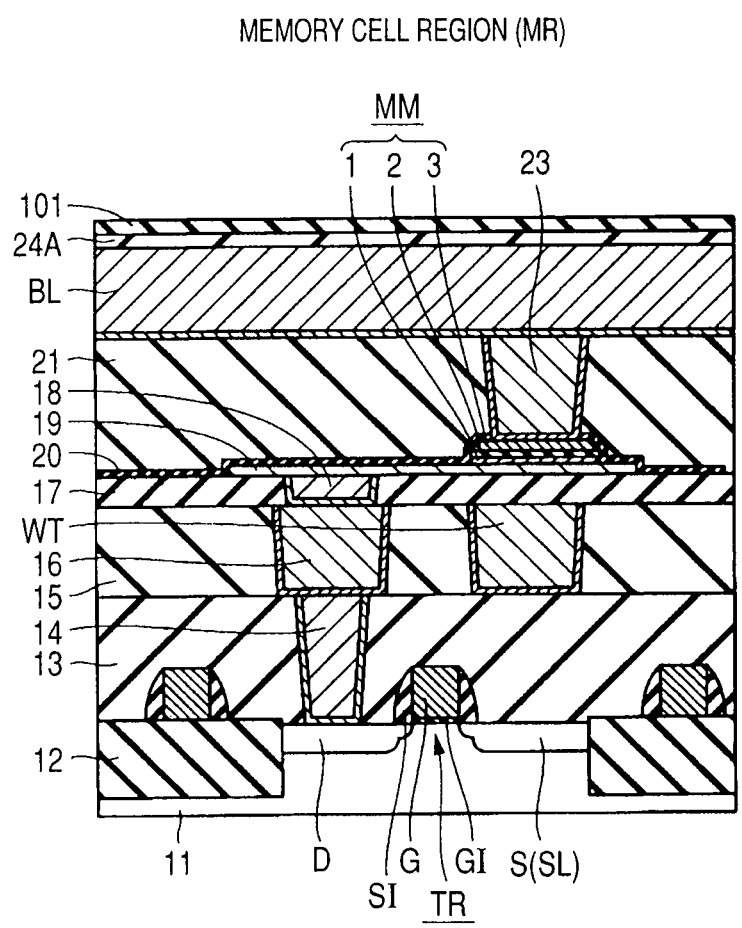
FIG. 13 is a schematic sectional view of a modification of the memory cell region shown in FIG. 2.

The magnetic shielding layer 101 may be made electrically non-conductive with the wiring layer (for example, the bit line BL) and not limited to the position in this embodiment. For example, when the magnetic shielding layer 101 is formed over the thin interlayer insulating film 24A having a thickness of 100 nm or less formed over the bit line BL as shown in FIG. 13, a magnetic shielding effect is obtained and also the dissipation of a wiring current magnetic field used for the operation of recording information can be suppressed, thereby obtaining secondary effects that the recording of information to the magnetic storage element MM can be carried out efficiently and that the consumption current can be reduced.

When a material having a relatively high dielectric constant such as a silicon nitride film is used as the protective film and oxidation barrier, and a magnetic shielding layer is used in a mixed device mounting a memory cell containing a magnetic storage element and a logic circuit, attention must be paid to the following. That is, for example, in a device comprising a logic circuit, capacity and resistance between metal wiring layers are set in consideration of the operation speed and access timing of the device. Therefore, when a material having a high dielectric constant, a low resistive element and a ferromagnetic material such as a magnetic shielding layer are arranged in the logic circuit part, capacity and resistance between metal wiring layers and inductance in the logic circuit part become outside the ranges of predetermined design parameters, whereby the device may not carry out the desired operation. To avoid this, the protective film is formed to cover only the magnetic storage element MM and not formed in the peripheral circuit region RR in which the logic circuit is formed.

After the predetermined steps, a wafer is diced to obtain the MRAM die 110 including a memory cell having the above structure.

(Process of Manufacturing Magnetic Storage Device)

Figure 14:
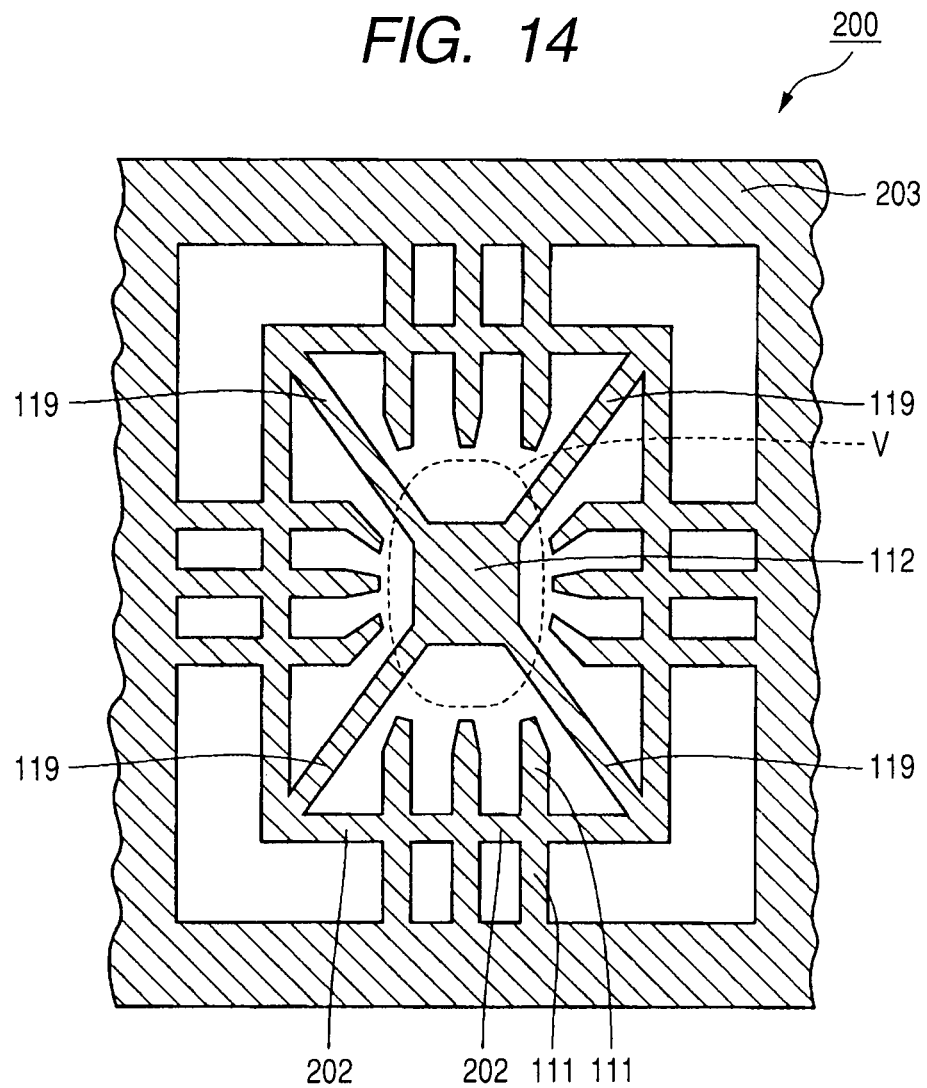
FIG. 14 is a schematic plan view of the first step in the process of manufacturing a memory storage device according to the embodiment of the present invention.

With reference to FIG. 14, a lead frame member 200 is prepared. The lead frame member 200 has a die pad 112 and die pad supports 119 shown in a section V in the figure (corresponding to FIG. 5), leads 111, a dam bar 202 and an outer frame 203.

With reference to FIG. 4(C), the magnetic shielding plate 113 is fixed over the die pad 112 though the adhesive layer 118a. The die pad 112 is made of a nickel alloy-based material and has a thickness of 0.1 to 0.2 mm. The adhesive layer 118a is composed of an insulating film-like material having a thickness of 10 to 50 µm. Subsequently, the MRAM die 110 is fixed over the magnetic shielding plate 113 through the adhesive layer 118b. The adhesive layer 118b is composed of an insulating film-like material having a thickness of 10 to 50 µm like the adhesive layer 118a. A single plate made of permalloy and having a thickness of 0.05 to 0.3 mm is used as the magnetic shielding plate 113 to reduce the height of the mold package 115.

Figure 16:
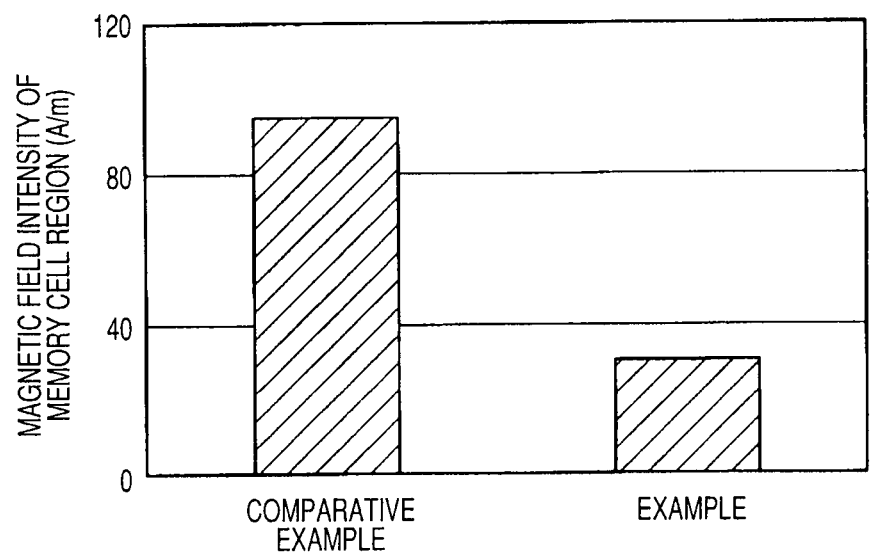
FIG. 16 is a graph of magnetic field intensity in the memory cell regions in the magnetic storage device according to the embodiment of the present invention and a magnetic storage device of a Comparative Example.

The magnetic shielding effect is greatly improved by making the die pad 112 having a magnetic shielding effect smaller in size than the MRAM die 110 and the magnetic shielding plate 113. That is, as shown in FIG. 16, in an example of this embodiment, when the external disturbing magnetic field is 8 kA/m (100 Oe), the magnetic field of a disturbing component in the memory cell region can be reduced to less than 80 A/m, that is, a geomagnetic level. In contrast to this, in a comparative example in which the die pad is made larger in size than the MRAM die 110, the magnetic field of the disturbing component exceeds 80 A/m.

When a non-magnetic metal such as Cu having no magnetic shielding effect is used as the material of the die pad 112, there is no particularly preferred size as the size of the die pad 112.

The magnetic shielding plate 114 is further fixed over the MRAM die 110 through the adhesive layer 118c. That is, the MRAM die 110 is sandwiched between the magnetic shielding plates 113 and 114. The interval between the two magnetic shielding plates 113 and 114 is the sum of the thickness of the MRAM die 110 and the thicknesses of the adhesive layers, that is, 0.15 to 0.5 mm. Since the interval between the two magnetic shielding plates is made sufficiently small, a sufficient shielding effect is obtained without surrounding the MRAM die 110 with the shielding plates. The thickness and the material required for the magnetic shielding plate 114 are the same as those of the magnetic shielding plate 113. Although the magnetic shielding plate 114 may be made smaller in size than the MRAM die 110, it must cover the entire surface of the memory cell region and is arranged to ensure that at least the shortest distance between the end of the memory cell region and the end of the magnetic shielding plate 114 becomes 0.3 mm or more.

With reference to FIG. 4(B), the leads 111 are bonded to bonding pads (not shown) over the MRAM die 110 by using wires 116 made of gold to be electrically coupled to the MRAM die 110.

Figure 15:
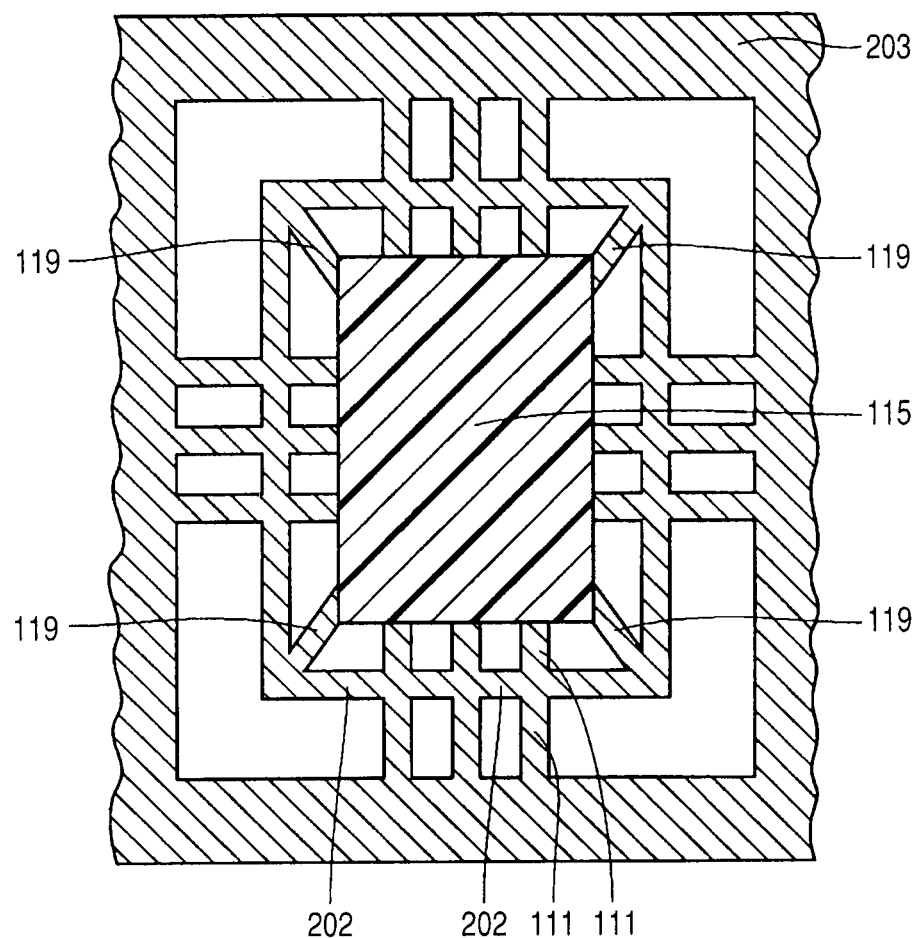
FIG. 15 is a schematic plan view of the second step in the process of manufacturing a memory storage device according to the embodiment of the present invention.

With reference to FIG. 15, the mold package 115 is formed from a resin mold material. The outer frame 203 and the dam bar 202 are then removed. Thereby, the magnetic storage device 100 (FIG. 4(A)) is obtained. According to this magnetic storage device 100, as the disturbing magnetic field is introduced into the inside of the magnetic shielding part, the disturbing magnetic field to be applied to the memory cell region MR is suppressed.

In the above-described manufacturing process, the insulating film-like material is used as the adhesive layer. A paste-like adhesive may also be used as long as it can bond the magnetic shield plate 113 to the die pad 112 and the magnetic shield plate 113 to the MRAM die 110. It is also possible to provide a magnetic shielding effect by adding a sheet-like layer molded from a ferromagnetic material such as Fe, Ni or Co, or an alloy material comprising any one of them as the main component or by dispersing particles as the above material into an adhesive as long as adhesive force is not greatly impaired. If there is an operation environment in which a satisfactory effect is obtained with a magnetic shielding structure comprising the die pad 112 and the leads 111, the magnetic shielding plate 113 may be omitted, and the die pad 112 and the MRAM die 110 may be fixed by an adhesive.

Although permalloy is given as an example of the material of the magnetic shielding plates 113 and 114, the present invention is not limited to this, and a material having magnetic characteristics such as a high magnetic permeability and a high saturation magnetic flux density may be used. More specifically, alloy materials containing a ferromagnetic material such as Fe, Ni or Co as the main component, preferably Ni—Fe alloy and Co—Fe alloy may be used. Further, materials having different magnetic characteristics may be used in combination in the die pad 112 and the magnetic shielding plate 113. For example, a high saturation magnetic flux density material having a saturation magnetic flux density of 1.2 tesla or more is used in the die pad 112 whereas a high magnetic permeability material having a relative magnetic permeability of 5,000 or more is used in the magnetic shielding plate 113. In the above-described manufacturing process, a single plate is used as the magnetic shielding plate 13. The present invention is not limited to this, and magnetic shielding materials having the same magnetic characteristics or different magnetic characteristics may be used to form layers.

A magnetic shielding plate having long sides and short sides is given as an example of the magnetic shielding plate 114 but the magnetic shielding plate 114 may be isotropic such as square or circular. When the magnetic shielding plate 114 has long sides and short sides, as the ratio of the long side to the short side increases, the amount of a magnetic flux flowing into the side walls on the long side becomes larger and shielding performance may deteriorate locally in the center part in the long-side direction of the magnetic shielding plate 114. Therefore, the ratio of the long side to the short side of the magnetic shielding plate 114 is preferably 3 or less, more preferably 1.5 or less. Further, the deterioration of shielding performance can be compensated for by increasing the thickness of the center portion in the long-side direction or by forming another magnetic shielding plate in the vicinity of the center portion. The material of the magnetic shielding plate 114 is, for example, a high magnetic permeability material having a relative magnetic permeability of 5,000 or more.

Figure 17:
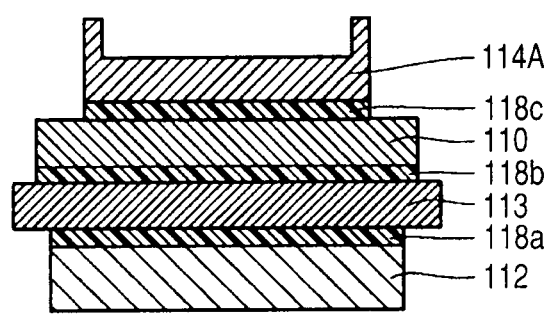
FIG. 17 is a diagram of a modification of the magnetic storage device shown in FIG. 4(C)
Figure 18A:
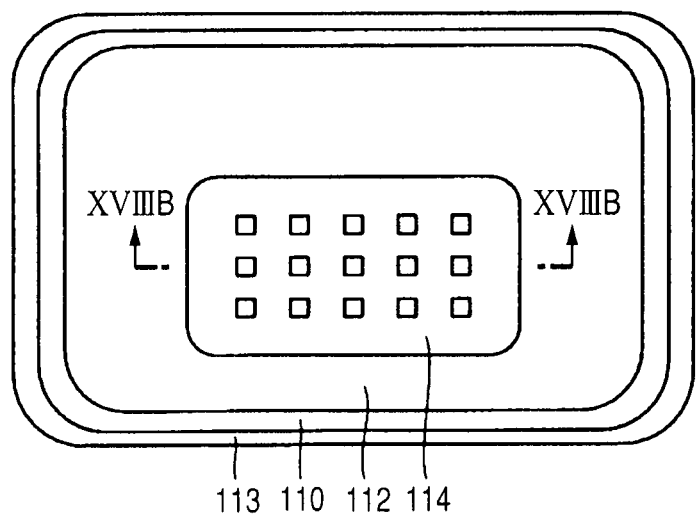
FIG. 18(A) is a first modification of the layout of FIG. 6(A) and FIG. 18(B) is a diagram of a first modification of the magnetic shielding plate shown in FIG. 6(B)
Figure 18B:
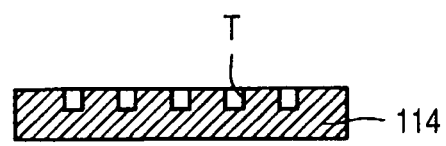
Figure 19A:
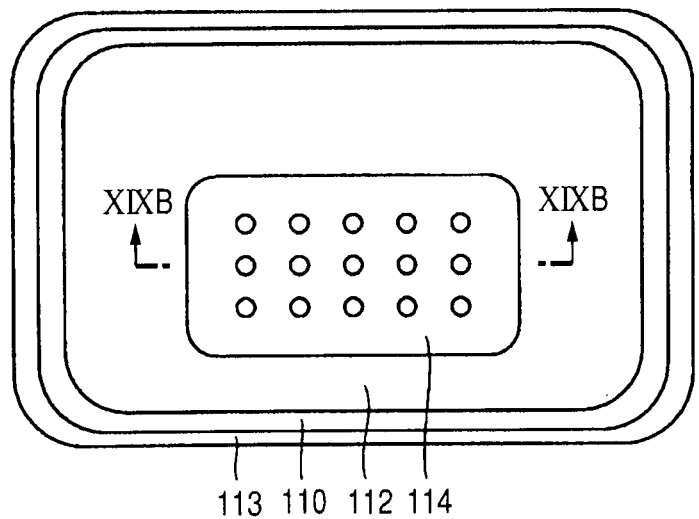
FIG. 19(A) is a diagram of a second modification of the layout of FIG. 6(A) and FIG. 19(B) is a diagram of a second modification of the magnetic shielding plate shown in FIG. 6(B)
Figure 19B:
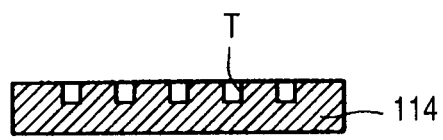
Figure 20A:
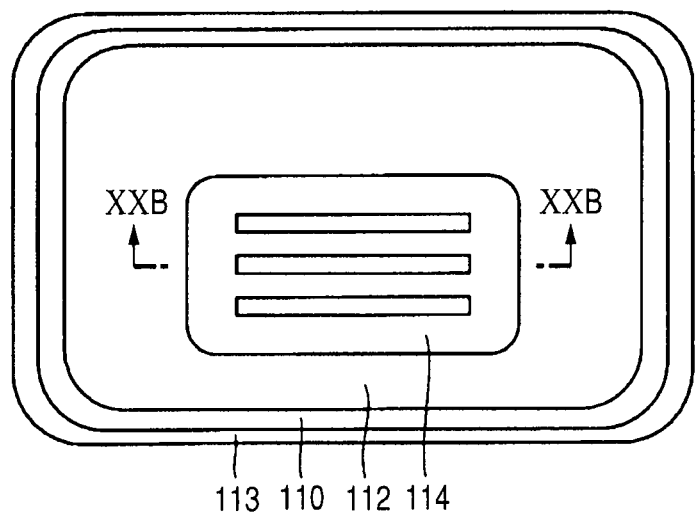
FIG. 20(A) is a diagram of a third modification of the layout of FIG. 6(A) and FIG. 20(B) is a diagram of a third modification of the magnetic shielding plate shown in FIG. 6(B).
Figure 20B:

In the above-described manufacturing process, in the manufacture of the mold package 115, the top surface of the magnetic shielding plate 114 comes into direct contact with the sealing material of the mold package 115. Then, as shown in FIG. 4(C), the top surface of the magnetic shielding plate 114 is made uneven to increase adhesive force, thereby obtaining a mold package structure having high reliability. When depressed portions extend through the magnetic shielding plate 114, a shielding effect is greatly impaired. Therefore, as shown in FIG. 4(C), the depth of each of the depressed portions is made smaller than the thickness of the magnetic shielding plate 114. Alternatively, as shown in FIG. 17, a modification structure 114A having projection portions in the film thickness direction at the ends of the magnetic shielding plate 114 may be used. The shape of the pattern of the depressed portions is not particularly limited but may be rectangular dot-like (FIGS. 18(A) and 18(B)), circular dot-like (FIGS. 19(A) and 19(B)), groove-like (FIGS. 20(A) and 20(B)) or a combination thereof from the viewpoint of manufacturing ease. The size of each depressed portion is not particularly limited but preferably 0.5 mm or less in order to increase the surface area.

As for electric coupling between the leads 111 and the MRAM die 110, the wires 116 made of gold are used. Another means may be used if an electric signal can be sent from the MRAM die 110 to the outside.

(Function and Effect)

In the above-described magnetic storage device 100 (FIG. 4(B)), the die pad 112 and the magnetic shielding plate 113 are made of a material having a high saturation flux density and a high magnetic permeability, and the die pad 112 is made smaller in size than the MRAM die 110. The magnetic shielding plate 114 which is larger in size than at least the memory region of the MRAM die 110 is formed to have a shape with a long side/short side ratio of 3 or less in a plan view and subjected to texture processing to increase its adhesion to the material of the mold package 115 so as to sandwich the MRAM die 110. Further, even in the production process of the MRAM die, the magnetic shielding layer 101 is formed. Since the magnetic field intensity which affects the memory cell region MR (FIG. 2) can be reduced to a geomagnetic level (FIG. 16) having high compatibility with existing mold packages by employing these even in a 8 kA/m (100 Oe) or more disturbing magnetic field, a magnetic storage device 100 which enables stable operation at the time of recording information and the stable retention of recorded information can be provided.

In a magnetic storage device comprising the above-described magnetic storage element MM, recorded information can be read without destroying a recorded state. Therefore, rewrite operation is not necessary and the read speed becomes high. Since the magnetization reversing speed is 1 nanosecond or less, information can be written very fast and stably by carrying out suitable magnetic shielding. Further, as for magnetization reversing operation, it is generally said that a fatigue phenomenon that characteristic properties are deteriorated by repeating reversal does not occur. That is, a nonvolatile memory device having no limits to the number of operations can be provided by the magnetic storage device called "MRAM".

The above characteristic feature is useful for the storage device alone and more useful in the case of a mixed device comprising the above memory cell MC (FIG. 1) and a logic circuit. That is, in the case of the mixed device, an interactive information handling environment is improved in the network environment and mobile communication based on high-speed operation. Further, the consumption power can be reduced and the operation environment can be greatly improved by using the magnetic storage device in computers and portable terminals.

One of the magnetic shielding plates 113 and 114 may be larger in size than the MRAM die 110 and the other may be smaller in size than the MRAM die 110. Preferably, the other magnetic shielding plate covers all the memory cell region MR of the MRAM die 110 in a plan view.

Further, in the above-described magnetic storage element and the above-described magnetic storage device, the memory cell MC (FIG. 1) provided with one magnetic storage element is given as an example but two or more magnetic storage elements may be provided for each memory cell and these memory cells may be formed in layers.

The embodiment disclosed herein is to be taken as illustrative in all aspects and not restrictive. Since the scope of the present invention is defined by the appended claims rather than by the description preceding them, and all changes that fall within meets and bounds of the claims or equivalence of such meets and bounds are therefore intended to be embraced by the claims.

The present invention can be advantageously applied to a magnetic storage device having a lead frame member.

What is claimed is:

1. A magnetic storage device comprising:
a die including: a substrate; a first wiring which is formed over the substrate and has a part extending in one direction; a second wiring which is formed over the substrate, intersects the first wiring in a plan view and is separate from the first wiring in the thickness direction of the substrate; a magnetic storage element at least part of which is sandwiched between the first and second wirings in a region where the first and second wirings intersect each other with a space therebetween; and a first magnetic shielding structure which is formed to cover the magnetic storage element in a plan view;
second and third magnetic shielding structures which sandwich the die in the thickness direction; and
a lead frame member which has the die mounted thereon, and contains a ferromagnetic material,
wherein the lead frame member overlaps with only part of the die in a plan view.

2. The magnetic storage device according to claim 1, wherein one of the second and third shielding structures is larger in size than the die, and the other is smaller in size than the die.

3. The magnetic storage device according to claim 2, wherein the other magnetic shielding structure covers all the memory cell region of the die in a plan view.

4. The magnetic storage device according to claim 2, wherein the second and third magnetic shielding structures cover all the memory cell region of the die, and the distances between the ends of the second and third shielding structures and the end of the memory cell region are least 0.3 mm.

5. The magnetic storage device according to claim 1, wherein a part overlapping with the die in a plan view of the lead frame member is made of a material having a high saturation magnetic flux density of 1.2 tesla or more, and the second and third magnetic shielding structures are made of a material having a high relative magnetic permeability of 5,000 or more.

6. The magnetic storage device according to claim 1, wherein at least one of the second and third magnetic shielding structures has a planar shape with long sides and short sides, and the ratio of the long side and the short side is 3 or less.

7. The magnetic storage device according to claim 1, wherein at least one of the second and third magnetic shielding structures is in contact with a mold structure and has a cyclic uneven structure on the contact surface with the mold structure.

8. The magnetic storage device according to claim 7, wherein the uneven structure has a dot-like, rectangular or groove-like shape.

9. The magnetic storage device according to claim 1, wherein the second and third magnetic shielding structures are each coupled to the die by an adhesive layer.

10. The magnetic storage device according to claim 9, wherein the adhesive layer contains a ferromagnetic material.

11. The magnetic storage device according to claim 1, wherein at least one of the second and third magnetic shielding structures has projection portions projecting in a direction away from the die at the ends in a plan view.

12. The magnetic storage device according to claim 1, wherein the interval between the second and third shielding structures is 0.15 to 0.5 mm.

13. The magnetic storage device according to claim 1, wherein the interval between at least one of the first and second wirings and the first magnetic shielding structure is 100 nm or less.

14. The magnetic storage device according to claim 1, wherein the first magnetic shielding structure is divided into a plurality of parts which extend in the extension direction of any one of the first and second wirings.

15. The magnetic storage device according to claim 1,
wherein the magnetic storage element comprises: a fixed layer whose magnetization direction is fixed; and a recording layer having a magnetization easy axis, and
wherein information is recorded by controlling the magnetization direction of the recording layer with a magnetic field produced by applying a predetermined current to the first and second wirings, and is read by a magnetoresistive effect.

16. The magnetic storage device according to claim 1,
wherein the magnetic storage element comprises: a fixed layer whose magnetization direction is fixed; and a recording layer having a magnetization easy axis, and
wherein information is recorded by controlling the magnetization direction of the recording layer with torque produced by applying a spin polarized current to the recording layer, and is read by a magnetoresistive effect.

* * * * *